(12) United States Patent
Kim

(10) Patent No.: US 7,615,769 B2
(45) Date of Patent: Nov. 10, 2009

(54) NONVOLATILE MEMORY DEVICE AND FABRICATION METHOD THEREOF

(75) Inventor: Tae Hoon Kim, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/769,984

(22) Filed: Jun. 28, 2007

(65) Prior Publication Data

US 2008/0083916 A1   Apr. 10, 2008

(30) Foreign Application Priority Data

Oct. 4, 2006   (KR) ...................... 10-2006-0097492

(51) Int. Cl.
*H01L 29/02* (2006.01)
(52) U.S. Cl. ................. 257/1; 257/2; 257/3; 257/4; 257/5; 257/E29.002
(58) Field of Classification Search ............... 257/1, 257/2, 3, 4, 5, E29.002
See application file for complete search history.

(56) References Cited

U.S. PATENT DOCUMENTS

| 7,339,185 | B2 * | 3/2008 | Song et al. ................... 257/3 |
| 2004/0145850 | A1 * | 7/2004 | Fukumoto et al. ............. 361/143 |
| 2007/0051936 | A1 * | 3/2007 | Pellizzer et al. ................ 257/4 |
| 2007/0076486 | A1 * | 4/2007 | Jeong et al. ............ 365/185.22 |
| 2007/0279974 | A1 * | 12/2007 | Dennison et al. ............ 365/163 |
| 2007/0295948 | A1 * | 12/2007 | Lam et al. ...................... 257/4 |

FOREIGN PATENT DOCUMENTS

| KP | 10-2005-0105297 | 11/2005 |
| KP | 10-2006-0070694 | 6/2006 |
| KR | 10-2005-0084319 | 8/2005 |
| KR | 10-2006-0128636 | 12/2006 |

* cited by examiner

*Primary Examiner*—Victor A Mandala
(74) *Attorney, Agent, or Firm*—Marshall, Gerstein & Borun LLP

(57) ABSTRACT

A nonvolatile memory device and a method for its fabrication may ensure uniform operating characteristics of ReRAM. The ReRam may include a laminated resistance layer that determines phase of ReRAM on an upper edge of a lower electrode for obtaining a stable threshold drive voltage level.

13 Claims, 11 Drawing Sheets

NONVOLATILE MEMORY DEVICE AND FABRICATION METHOD THEREOF

CROSS-REFERENCE(S) TO RELATED APPLICATIONS

The present application claims the benefit of priority to Korean patent application number 10-2006-97492, filed on Oct. 4, 2006, the entire contents of which are incorporated herein by reference.

BACKGROUND OF THE INVENTION

The present application relates to a nonvolatile memory device and a fabrication method thereof; and, more particularly, to a technology of resistance switching random access memory (ReRAM) using phase changes in resistance.

In general, a semiconductor memory device includes many memory cells being circuitly connected. One exemplary semiconductor memory device is a dynamic random access memory (DRAM). A typical DRAM unit memory cell consists of one switch and one capacitor, and provides benefits such as a high degree of integration and a fast operating speed.

However, since the DRAM memory cell makes two states "0" and "1" with respect to change of a charge, it loses all stored data when power is turned off (i.e., a volatile memory device), so it is difficult to retain data.

To facilitate data retention, research on a new memory technology attempts to make a binary state corresponding to "0" and "1" in DRAM by using a new variable, not the charge.

Nonvolatile memory devices now being studied include magnetic random access memory (MRAM), ferroelectric random access memory (FRAM), phase-change ransom access memory (PRAM) and so on.

MRAM stores data using the change in magnetization direction at a tunnel junction, and FRAM stores data using polarization of ferroelectrics. Although each has merits as well as defects, both are basically known for a high integration density, a high operating speed, and an ability of low power operation, and have the potential to provide good data retention.

PRAM stores data using a change in resistance value in accordance with the phase change of a specific material, and consists of one resistor and one switch (transistor). The resistor used for PRAM is a chalcogenide resistor, which exists in a crystal state or in an amorphous state, depending on a formation temperature. Because resistance in the amorphous state is greater than that in the crystal state, a memory device may be fabricated using these characteristics. When a DRAM process is used in the fabrication of the PRAM, an etching operation may be difficult and may even take a long time. In addition, the memory device uses a transistor or diode for switching, but its structure is complicated and accurate switching operation is not easy. A simplified structure for the memory device is preferred and is being sought.

Studies and development for resistance switching random access memory (ReRAM), where high and low states of a resistance value are reproducibly switched in accordance with an applied voltage from outside, are making progress. For example, one such ReRAM device exists as an insulator in its intrinsic state, but its phase turns to a metal or semiconductor state due to an applied voltage from outside, exhibiting changes in physical properties.

SUMMARY OF THE INVENTION

A nonvolatile memory device and its fabrication method may ensure uniform operating characteristics of ReRAM by laminating a resistance layer that determines phase of ReRAM on an upper edge of a lower electrode for obtaining a stable threshold drive voltage level.

For example, a nonvolatile memory device may include a first electrode; a resistance layer formed along an upper edge of the first electrode; an insulating layer filled inside the resistance layer; and an second electrode formed over the resistance layer and over the insulating layer. The resistance layer may have a laminated structure made up of at least two different material layers.

A fabrication method of a nonvolatile memory device may include forming a first interlayer insulating film including a first electrode over an upper part of a semiconductor substrate; forming a second interlayer insulating film including a contact hole exposing the first electrode over an upper part of the first interlayer insulating film; forming a laminated structure made up of a first, a second, and a third resistance layers on sidewalls of the contact hole; forming a second resistance layer filling up an inside of the laminated structure; forming a second electrode over the laminated structure and over the insulating layer; and forming a third interlayer insulating film with a contact plug overlapping with the first electrode over an upper part of the first electrode.

Accordingly, the nonvolatile memory device and its fabrication method may be advantageously used for ensuring uniform operating characteristics of ReRAM by laminating a resistance layer that determines phase of ReRAM on an upper edge of a lower electrode for obtaining a stable threshold drive voltage level.

Other advantages and features of the invention will be understood from the following description and will also be appreciated and understood from the herein described embodiments. Further, advantages of the invention will readily be seen that they can be realized by the structures, methods and combinations thereof specified in the claims.

DESCRIPTION OF SPECIFIC EMBODIMENTS

Hereinafter, preferred embodiments of the present invention will be set forth in detail with reference to the accompanying drawings so that those skilled in the art can easily carry out the invention.

Figure 1:
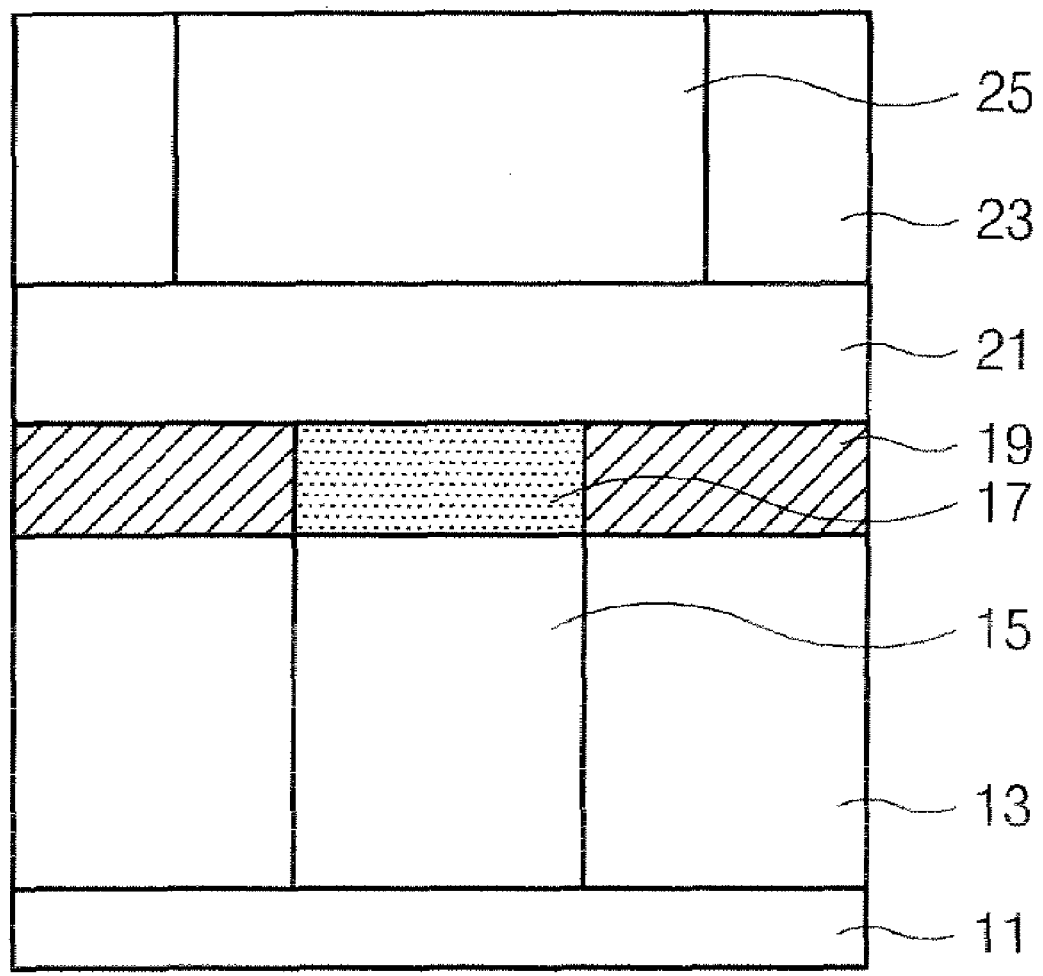
FIG. 1 a cross-sectional view showing a method for fabricating a nonvolatile memory device.

FIG. 1 is a cross-sectional view showing a method for fabricating a nonvolatile memory device. A first interlayer insulating film 13 is formed on an upper part of a semiconductor substrate 11. The first interlayer insulating film 13 is etched by a photo etching process using a contact mask that defines a lower electrode, to form a lower electrode contact hole (not shown).

The lower electrode contact hole is filled up with a metal film to form a lower electrode 15. A resistance layer 17 is formed on an upper part of the lower electrode 15. An insulating layer 19 is formed on an upper part of the first interlayer insulating film 13 exclusive of the resistance layer 17. An upper electrode 21 is formed over the resistance layer 17 and over the insulating layer 19. Next, a second interlayer insulating film 23 including a contact plug 25 is formed over the upper electrode 21.

Figure 2:
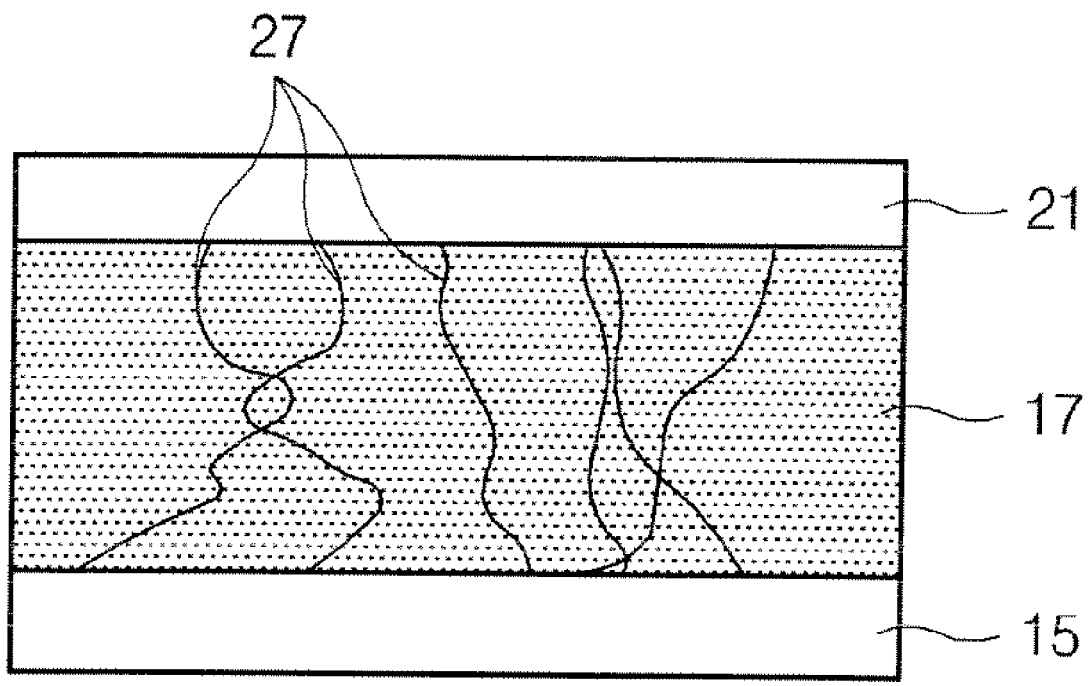
FIG. 2 is a plan view explaining the operating principles of a nonvolatile memory device.

FIG. 2 is a plan view explaining the operating principles of a nonvolatile memory device. As is apparent from the drawing, a ReRAM exists as an insulator ("0" resistance state) in its intrinsic state. However, when a voltage higher than a threshold drive voltage (Vt) is applied from outside through the contact plug 25, a current path 27 is formed inside the resistance layer 17 and the phase of the ReRAM changes to a metal/semiconductor state ("1" resistance state).

Here, the threshold drive voltage (Vt) is a voltage sufficient to change the phase of ReRAM from an insulator state to a metal/semiconductor state. At this time, a current flow rate depending on an applied voltage to the memory device in the insulator state and in the metal/semiconductor state, is measured to decide whether ReRAM performs a read operation or a write operation.

For example, if a measured current flow rate is larger than a reference value, it may indicate data is being written. Meanwhile, if a measured current flow rate is smaller than a reference value, it may indicate data is being read.

However, in case of the nonvolatile memory device and its fabrication method, the current path 27 is randomly formed inside the resistance layer 17 during a read or write operation, resulting in a broad dispersion of the threshold drive voltage (Vt). Therefore, it may be difficult to discern whether ReRAM is performing a read operation or a write operation. Moreover, uniform operating characteristics of ReRAM are difficult to obtain.

Figure 3A:
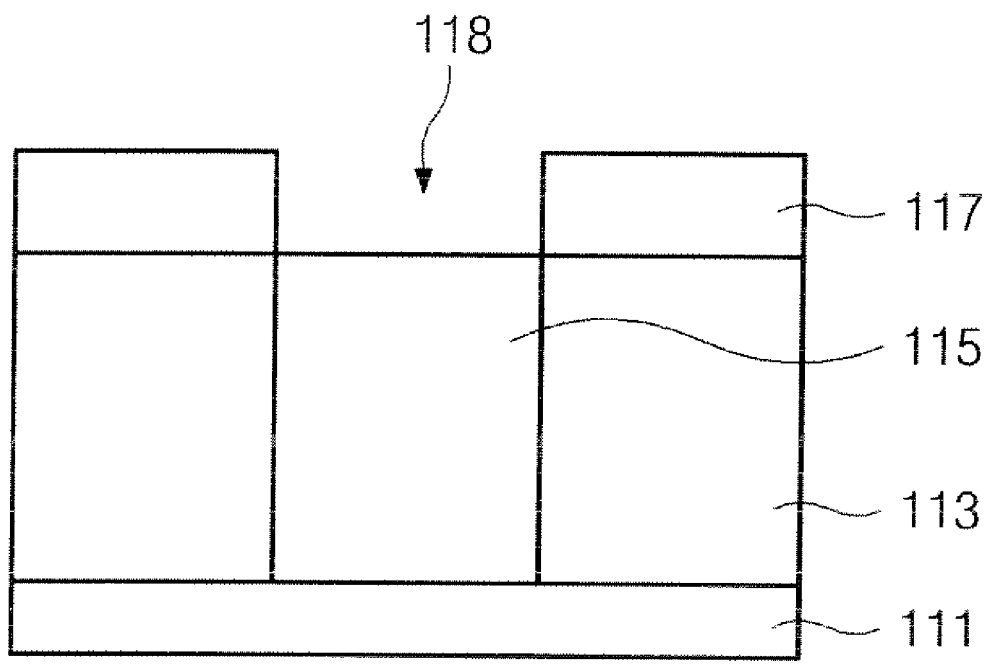
FIGS. 3a through 3g are cross-sectional views stepwisely showing a method for fabricating a nonvolatile memory device, in accordance with a preferred embodiment of the present invention.

FIGS. 3a through 3g are cross-sectional views, stepwisely showing a method for fabricating a nonvolatile memory device, in accordance with a preferred embodiment of the present invention. Referring to FIG. 3a, a first interlayer insulating film 113 is formed on an upper part of a semiconductor substrate 111. The first interlayer insulating film 113 is etched by a photo etching process using a contact mask that defines a lower electrode, to form a first contact hole. The first contact hole is filled up with a metal film to form a lower electrode 115.

The metal film for the lower electrode is composed of a material selected from platinum group elements, for example, Pt, Ir and their metallurgical equivalents. A second interlayer insulating film 117 is formed on an upper part of the lower electrode 115. Then, the second interlayer insulating film 117 is etched by a photo etching process using a contact mask that defines a lower electrode, to form a second contact hole 118.

Figure 3B:
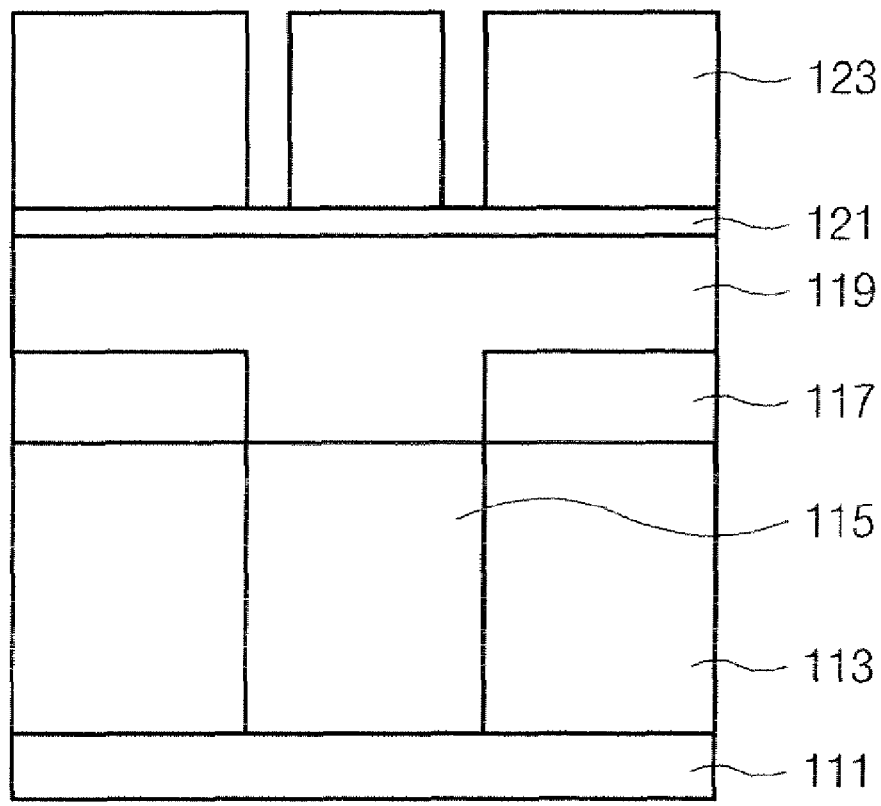

Referring to FIG. 3b, a sacrifice oxide film 119, a hard mask layer 121, and a photoresist 123 are formed one by one over an entire upper surface including the second contact hole 118. The photoresist 123 is exposed and developed by an exposure mask defining a first, a second, and a third resistance layer expected region, to form a photoresist pattern 123.

Figure 3C:
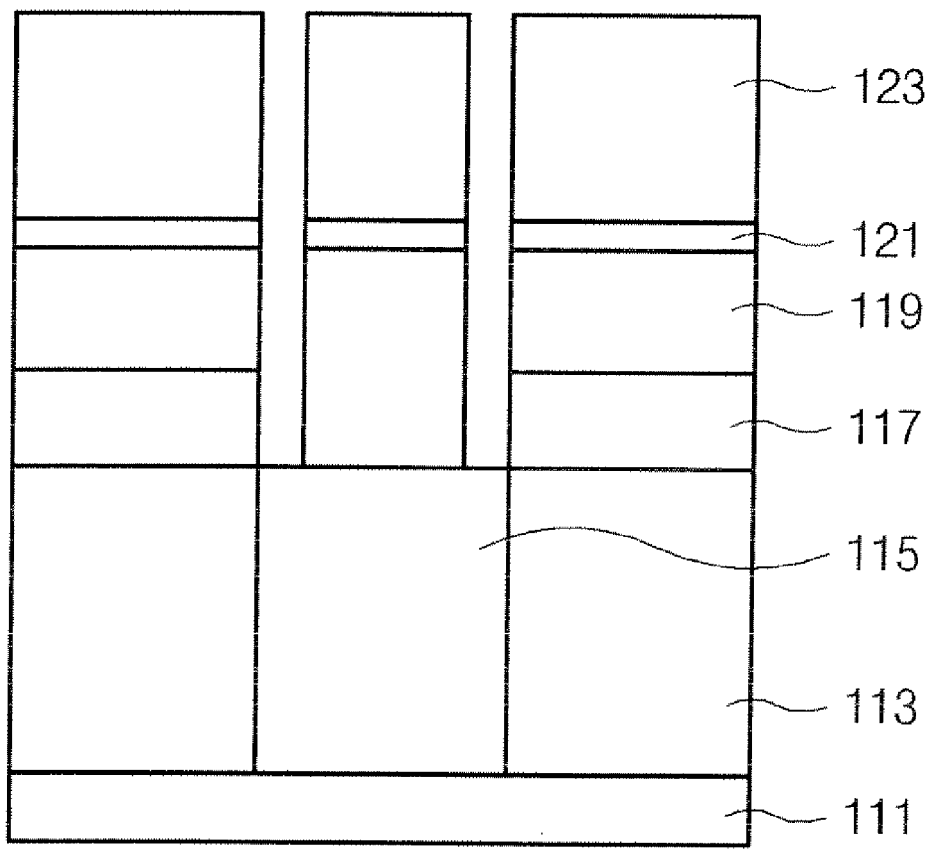

Referring to FIG. 3c, the hard mask layer 121 and the sacrifice oxide film 119 are etched using the photoresist pattern 123 as a mask.

The composite resistance structure is then formed The composite resistance structure may be a laminate structure that includes a first resistance layer 125a, a second resistance layer 125b and a third resistance layer 125c.

Figure 3D:
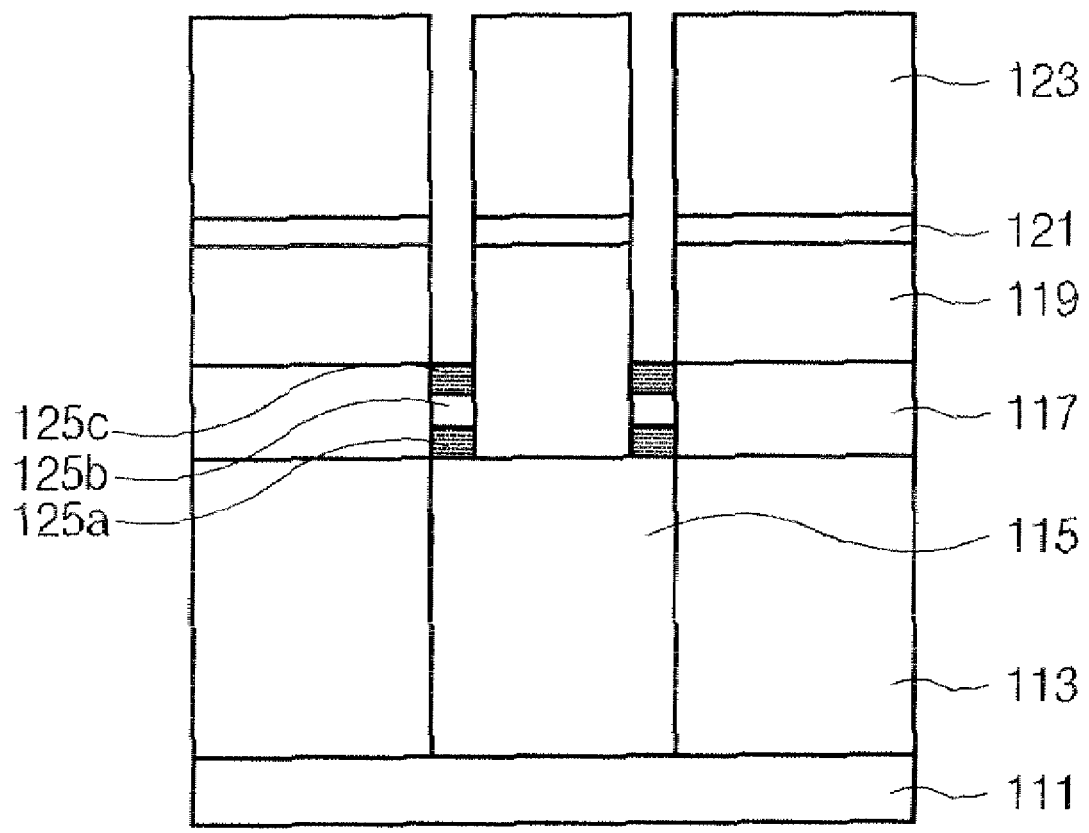

Referring to FIG. 3d, the first resistance layer 125a is formed on an upper part of the exposed lower electrode 115.

The first resistance layer 125a may be formed of an oxide, and preferably is formed of an oxide containing niobium (Nb).

For example, suitable oxides may contain a material such as NbO2, Nb2O5 or equivalents or combinations thereof, and may be formed by any suitable process, such as a chemical vapor deposition (CVD) process or a physical vapor deposition (PVD) process. Next, the first resistance layer 125a is subjected to an annealing process to make a dense oxide film. Then, a second resistance layer 125b is formed on an upper part of the first resistance layer 125a.

The second resistance layer 125b is preferably formed of an oxide containing nickel (Ni) or an oxide containing titanium (Ti) according to a CVD process or a PVD process. The oxide containing Ni may contain a material such as Ni2O3 or NiO2, and the oxide containing Ti may contain a material such as TiO2.

The second resistance layer 125b is subjected to an annealing process to make a dense oxide film. Then, a third resistance layer 125c is formed on an upper part of the second resistance layer 125b. At this time, the third resistance layer 125c is preferably formed of the same oxide, e.g., the oxide containing Nb, used for the first resistance layer 125a, according to a CVD process or a PVD process. The third resistance layer 125c is subjected to an annealing process to make a dense oxide film.

Figure 3E:
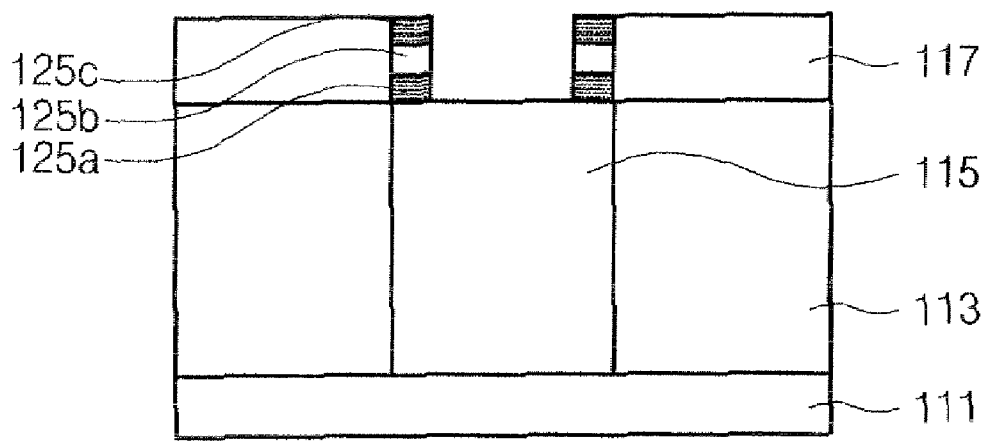

Referring to FIG. 3e, the photoresist pattern 123, the hard mask layer 121, and the sacrifice oxide film 119 are removed.

Figure 3F:
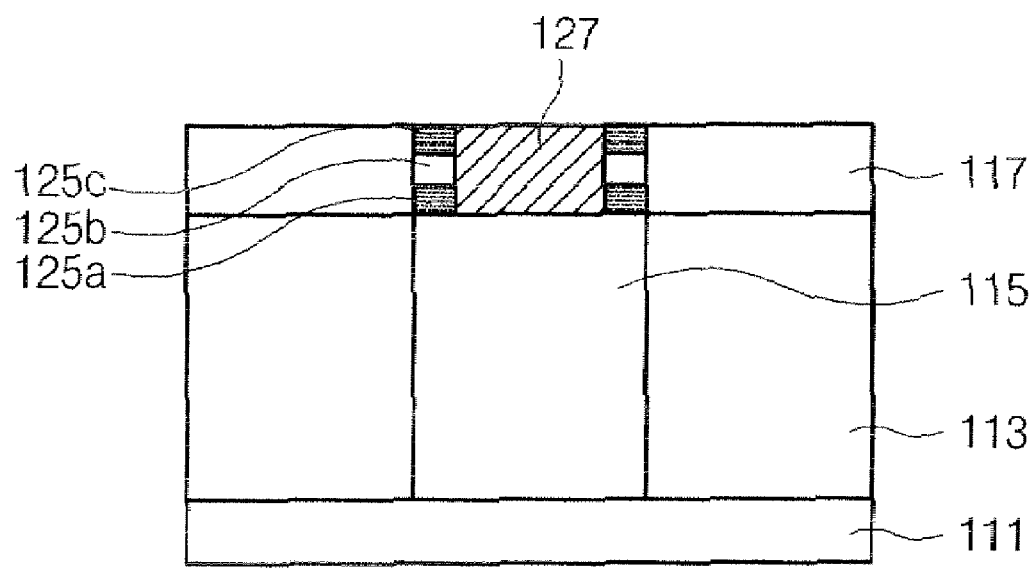

Referring to FIG. 3f, an insulating material is applied to an entire upper surface, and a planarization process is carried out until the second interlayer insulating film 117 is exposed. In this manner, an insulating layer 127 that fills the insides of the first, second, and third resistance layers 125a, 125b, and 125c.

The insulating material is preferably composed of an oxide, such as an aluminum (Al) based oxide having a higher threshold drive voltage for switching phase than a threshold drive voltage for switching phase of the first, second, and third resistance layers 125a, 125b, and 125c. The Al based oxide may contain a material such as Al2O3, and may be formed by a CVD process or a PVD.

Figure 3G:
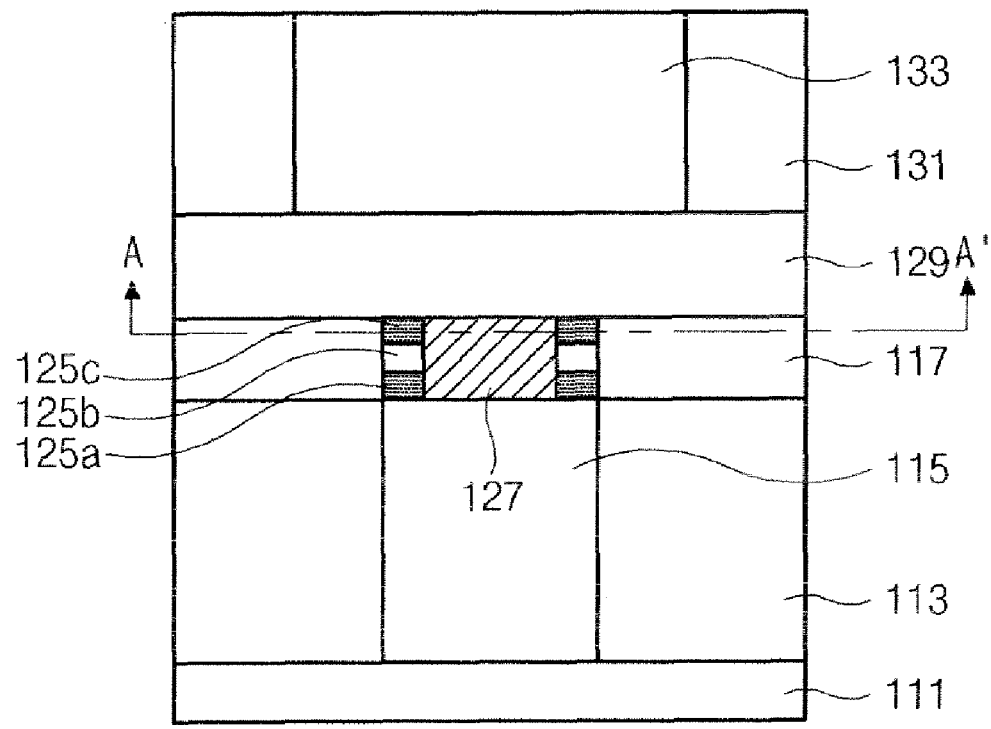

Referring to FIG. 3g, an upper electrode 129 is formed over the third resistance layer 125c and over the insulating layer 127. The upper electrode 129 is composed of a material selected from platinum group elements, for example, Pt, Ir and their metallurgical equivalents. Next, a third interlayer insulating film 131, which includes a contact plug 133 overlapping with the lower electrode 115, is formed over the upper electrode 129. The contact plug 133 may partially overlap with the lower electrode 115.

Figure 4:
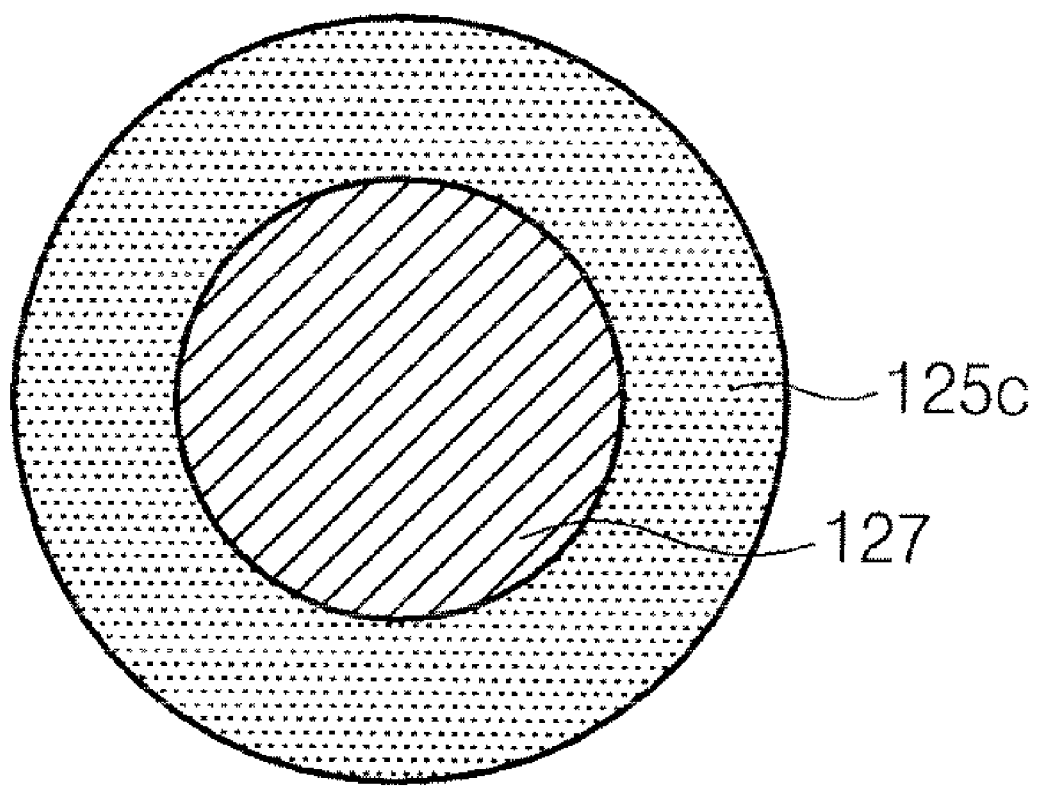
FIG. 4 is a plan view taken along the cut plane A-A' of FIG. 3g.

FIG. 4 is a plan view taken along the cut plane A-A' of FIG. 3g. As shown in the drawing, the third resistance layer 125c is formed in a looped curve shape, and the second insulating layer 127 is formed inside the third resistance layer 125c.

Figure 5:
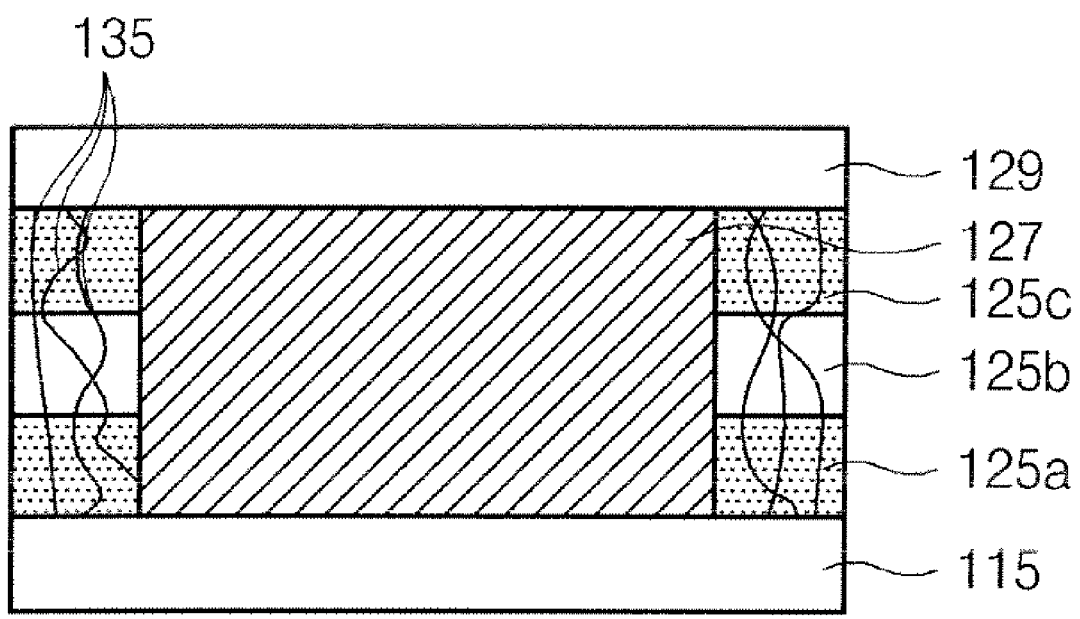
FIG. 5 is a plan view explaining the operating principles of a nonvolatile memory device, in accordance with a preferred embodiment of the present invention.

FIG. 5 is a plan view explaining the operating principles of a nonvolatile memory device, in accordance with a preferred embodiment of the present invention. As shown, an embodiment of ReRAM in accordance with the present invention exists as an insulator ("0" data) in its intrinsic state. However, when a voltage higher than a threshold drive voltage (Vt) is applied from outside through the contact plug 133, a current path 135 is formed inside of the first, second, and third resistance layers 125a, 125b, and 125c, causing the phase of the ReRAM to change into a metal/semiconductor state.

A current flow rate depending on the voltage applied to the memory device in the insulator state and/or in the metal/semiconductor state is measured to decide whether ReRAM performs a read operation or a write operation. For example, where the first resistance layer 125a and the third resistance layer 125c are composed of different materials from that of the second resistance layer 125b, their resistance values are also different from each other. Therefore, while ReRAM is in the metal/semiconductor state, data having a level corresponding to the resistance value (data with a level of "1" or a level between "0" and "1") is read or written.

Moreover, because the first, second and third resistance layers 125a, 125b, and 125c are preferably formed on the sidewalls of the second contact hole 118, the current path 135 at the time of application of the threshold drive voltage (Vt) from outside can be contained at the edges. In result, the threshold drive voltage (Vt) level becomes stable, and uniform operating characteristics may be ensured for the device.

Furthermore, ReRAM in accordance with one or more of the herein described embodiments of the present invention and combinations thereof may replace a diode or a transistor used in DRAM.

While the present invention has been described with respect to particular preferred embodiments, it will be apparent to those skilled in the art that various changes and modifications may be made without departing from the spirit and scope of the invention as defined in the following claims.

What is claimed is:

1. A nonvolatile memory device, comprising:
    a first electrode;
    a resistance layer formed along an edge of the first electrode;
    an insulating layer filled inside the resistance layer; and
    a second electrode formed over the resistance layer and over the insulating layer,
    wherein the resistance layer has a composite structure made up of at least two different materials, and the insulating layer comprises a material having a first threshold drive voltage for switching phase different than a second threshold drive voltage for the resistance layer.

2. The nonvolatile memory device of claim 1, wherein the first electrode and the second electrode comprise platinum group elements or their metallurgical equivalents.

3. The nonvolatile memory device of claim 2, wherein the platinum group elements include platinum (Pt) and iridium (Ir).

4. The nonvolatile memory device of claim 1, wherein the first threshold drive voltage is higher than the second threshold drive voltage.

5. The nonvolatile memory device of claim 1, wherein the insulating layer comprises an oxide containing aluminum (Al).

6. The nonvolatile memory device of claim 5, wherein the oxide containing Al includes Al2O3.

7. The nonvolatile memory device of claim 1, wherein the resistance layer comprises:
    a first resistance layer formed over a portion of the first electrode
    a second resistance layer formed over a portion of the first resistance layer; and
    a third resistance layer formed over a portion of the second resistance layer.

8. The nonvolatile memory device of claim 7, wherein the first resistance layer and the third resistance layer comprise an oxide containing niobium (Nb).

9. The nonvolatile memory device of claim 8, wherein the oxide containing Nb includes NbO2 and Nb2O5.

10. The nonvolatile memory device of claim 7, wherein the second resistance layer comprises an oxide containing nickel (Ni) or an oxide containing titanium (Ti).

11. The nonvolatile memory device of claim 9, wherein the oxide containing Ni includes Ni2O and NiO2.

12. The nonvolatile memory device of claim 9, wherein the oxide containing Ti includes TiO2.

13. The nonvolatile memory device of claim 1, wherein the resistance layer comprises a laminate including at least two different material layers.

* * * * *